(12) United States Patent
Chang

(10) Patent No.: US 8,526,194 B2
(45) Date of Patent: Sep. 3, 2013

(54) ANTI-ULTRAVIOLET MEMORY DEVICE AND FABRICATION METHOD THEREOF

(75) Inventor: Hwa-Hsiang Chang, Taipei County (TW)

(73) Assignee: Princeton Technology Corporation, Hsin Tien, Taipei County (TW)

( * ) Notice: Subject to any disclaimer, the term of this patent is extended or adjusted under 35 U.S.C. 154(b) by 198 days.

(21) Appl. No.: 13/115,568

(22) Filed: May 25, 2011

(65) Prior Publication Data

US 2011/0292628 A1 Dec. 1, 2011

(30) Foreign Application Priority Data

May 26, 2010 (TW) .................. 99116784 A

(51) Int. Cl.
*H05K 1/18* (2006.01)
*H05K 7/00* (2006.01)
*H01L 23/02* (2006.01)

(52) U.S. Cl.
USPC ..................... 361/764; 361/783; 257/681

(58) Field of Classification Search
USPC ................. 361/737, 748, 751, 756, 757, 760, 361/761, 762, 763, 764, 765, 766, 767, 768, 361/771, 772, 774, 779, 783, 785, 793; 257/323, 679, 681, 723, 729, 749
See application file for complete search history.

(56) References Cited

U.S. PATENT DOCUMENTS

| | | | | |
|---|---|---|---|---|
| 5,244,840 A * | 9/1993 | Kodai et al. | ..................... | 29/841 |
| 5,285,107 A * | 2/1994 | Kazami et al. | ................ | 257/680 |
| 5,410,181 A * | 4/1995 | Zollo et al. | .................... | 257/681 |
| 5,478,007 A * | 12/1995 | Marrs | ...................... | 228/180.22 |
| 2006/0087016 A1* | 4/2006 | Wada et al. | .................. | 257/679 |

* cited by examiner

*Primary Examiner* — Hoa C Nguyen
*Assistant Examiner* — Binh Tran
(74) *Attorney, Agent, or Firm* — Muncy, Geissler, Olds & Lowe, PLLC

(57) ABSTRACT

The invention provides an anti-UV electronic device and fabrication method thereof. The anti-ultraviolet (anti-UV) electronic device includes an integrated circuit die, wherein the integrated circuit die has an ultraviolet (UV) light erasable memory; and an anti-UV light layer is formed on and covers the ultraviolet (UV) light erasable memory.

4 Claims, 3 Drawing Sheets

ANTI-ULTRAVIOLET MEMORY DEVICE AND FABRICATION METHOD THEREOF

CROSS REFERENCE TO RELATED APPLICATIONS

This application claims priority of Taiwan Patent Application No. 099116784, filed on May, 26, 2010, the entirety of which is incorporated by reference herein.

BACKGROUND OF THE INVENTION

1. Field of the Invention

The present invention relates to an electronic device, and in particular relates to an anti-ultraviolet (anti-UV) electronic device and fabrication method thereof.

2. Description of the Related Art

Semiconductor devices have gradually reduced in size, in recent years, as consumer electronic products have become lighter, thinner, shorter and smaller. For various electronic products, electronic paper display (electronic paper) with low power consumption, a lightweight, thinness, and environmental friendly advantages, have gained research attention.

If the electronic paper display is used in a smart card, users can change the password at any time to implement security operations, wherein the security operations would be shown in the chip card display. Therefore, improving smart card security.

However, as electronic paper display control ICs include one time programmable read only memory (OTP ROM), the data in the OTP ROM is erasable by UV light when the OTP ROM is irradiated by UV light for a long period of time thereby reducing its reliability.

Thus, there is a need to develop an anti-UV electronic device to avoid memory data from being erased.

BRIEF SUMMARY OF THE INVENTION

The invention provides an anti-ultraviolet (anti-UV) electronic device, comprising: an integrated circuit die, wherein the integrated circuit die has an ultraviolet (UV) light erasable memory; and an anti-UV light layer is formed on and covers the ultraviolet (UV) light erasable memory.

The invention also provides a method for fabrication of an anti-UV electronic device, comprising: providing a wafer; forming a plurality of integrated circuit dies in the wafer, wherein each of the integrated circuit die has a UV light erasable memory; and forming an anti-UV light layer on each of the UV light erasable memory.

The invention also provides an anti-UV electronic device, comprising: a printed circuit board (PCB), wherein the printed circuit board has a active device; an integrated circuit die formed on the printed circuit board, wherein the integrated circuit die has an ultraviolet (UV) light erasable memory and an ultraviolet (UV) light erasable surface of the ultraviolet (UV) light erasable memory facing the printed circuit board; a first substrate and a second substrate, wherein the first substrate and the second substrate are disposed oppositely and encapsulate the printed circuit board and integrated circuit die, and the second substrate has a gold finger, wherein the gold finger electrically connects to the active device; and an anti-UV layer formed on the printed circuit board, the first substrate and the integrated circuit die, corresponding to the ultraviolet (UV) light erasable surface.

A detailed description is given in the following embodiments with reference to the accompanying drawings.

BRIEF DESCRIPTION OF THE DRAWING

For a more complete understanding of the present invention, and the advantages thereof, reference is now made to the following descriptions taken in conjunction with the accompanying drawings, in which.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
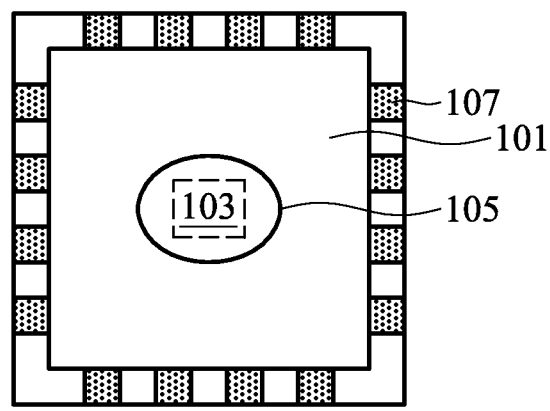
FIG. 1 shows a top-view schematic representation of an anti-UV electronic device in accordance with the first embodiment of the invention.

Referring to FIG. 1, the invention provides an anti-UV electronic device 100 which comprises an integrated circuit die 101, wherein the integrated circuit die 101 comprises an electrophoretic display (EPD) die. The integrated circuit die 101 has an ultraviolet (UV) light erasable memory 103 (dashed line position), an anti-UV light layer 105 and a plurality of bonding pads 107. In one preferred embodiment, the UV light erasable memory 103 comprises a one time programmable read only memory (OTP ROM). The anti-UV light layer 105 is formed on and covers the UV light erasable memory 103. As shown in FIG. 1, the anti-UV light layer 105 completely covers the UV light erasable memory 103 and has a thickness of about 8-100 μm. Thus, the integrated circuit die 101 has an anti-UV effect to protect the data in the UV light erasable memory 103. The scope of the coverage is larger than the area of the UV light erasable memory 103 by about 30%, preferably about 50%. However, the scope of the coverage is not limited to the size of the plotted graph FIG. 1, and the coverage which is larger than the area of the UV light erasable memory 103 is included within the scope of the invention.

The anti-UV light layer 105 comprises a resin and inorganic particles. The resin comprises, but is not limited to epoxy, polyester resin, polyimide resin, and inorganic particles such as $SiO_2$, $TiO_2$, $Al_2O_3$ or $CaCO_3$. In one embodiment, the anti-UV light layer 105 is a transparent anti-UV nano-coating or anti-heat coating layer.

The bonding pads 107 are disposed to electrically connect to the outer bonding circuits (not shown in FIG. 1), wherein the number, size, and shape of the bonding pads are adjustable according to actual applications by those skilled in the art.

Note that in order to prevent the data in the memory from being erased by UV light in prior art, a black adhesive tape is adhered on the package of the memory. However, the black adhesive tape has an unignorable thickness; thus the memory is hindered from meeting standard thickness requirements. Furthermore, owing to the degradation of the black adhesive tape, the memory does not maintain stable anti-UV ability. The invention provides an anti-UV electronic device in which the data in the integrated circuit die 101 is not erased by UV light by forming the anti-UV light layer 105 on the UV light erasable memory 103. Further, when the integrated circuit die 101 of the invention is used in a smart card, the thickness of the anti-UV light layer 105 is only about several μm; thus the thickness of the smart card is not significantly increased. The anti-UV light layer formed by a good semiconductor manufacturing process can have consistent quality and long service life.

Figure 2:
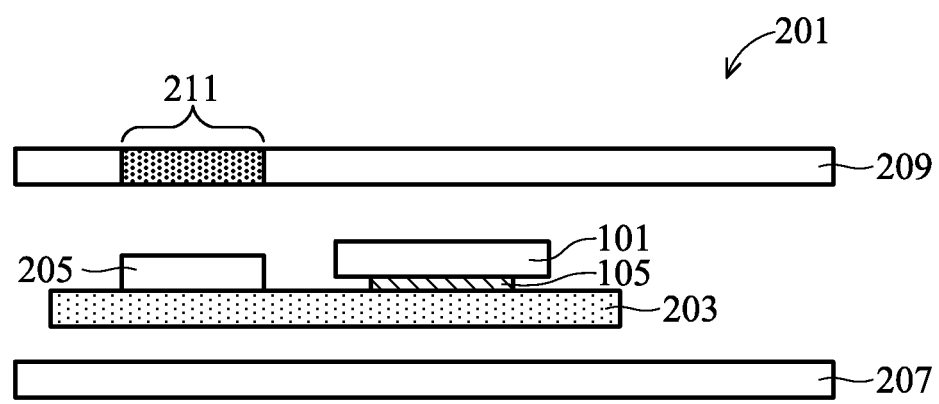
FIG. 2 shows a cross-sectional schematic representation of an anti-UV electronic device in accordance with the first embodiment of the invention used in a smart card.

FIG. 2 shows a cross-sectional schematic representation of the anti-UV electronic device of FIG. 1 used in a smart card 201, wherein like elements are identified by the same reference numbers as in FIG. 1, and are thus omitted for clarity.

The smart card 201 comprises a printed circuit board (PCB) 203, an active device 205, a first substrate 207, a second substrate 209 and a gold finger 211 formed in the second substrate 209. The integrated circuit die 101 and the active device 205 are formed on the printed circuit board 203 and electrically connect to each other. The first substrate 207 and the second substrate 209 are disposed oppositely and the printed circuit board 203, and the integrated circuit die 101 and the active device 205 are encapsulated by the first substrate 207 and the second substrate 209.

Further, the anti-UV light layer 105 which is formed on the integrated circuit die 101 faces to the printed circuit board 203. The integrated circuit die 101 is bonded to the printed circuit board 203 by a flip-chip bonding process (or chip on flex process). The printed circuit board 203 has electrical wire connection structures (not shown in figures) which electrically connects to the active device 205, and the active device 205 electrically connects to the gold finger 211 formed in the second substrate 209.

The active device 205 is a control integrated circuit (IC) for the control of the smart card, such as smart card control IC chip. The first substrate 207 and the second substrate 209 comprise, but are not limited to, plastic substrates, such as polyester resin, polymethacrylate (PMMA), polyimide resin, polyolefin resin, polycarbonate resin, polyurethane resin, triacetate cellulose (TAC) or combinations thereof.

In one preferred embodiment, the size appearance of the smart card 201 comprises, but is not limited to, a width of 85.60 mm, a height of about 53.98, and a thickness of about 0.76 mm, to meet ISO/IEC 7810 requirements. Note that the size of the smart card 201 is not limited to the above-mentioned sizes, and meeting the ISO/IEC 7810 requirements are included within the scope of the invention.

Figure 3:
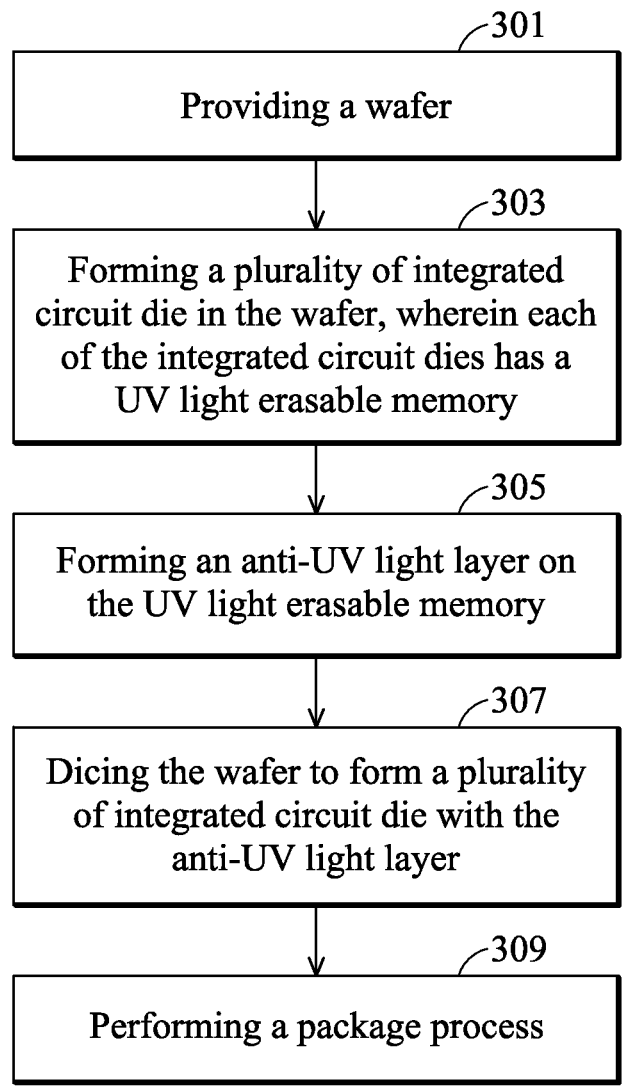
FIG. 3 shows a flow chart schematic representation of fabrication of an anti-UV electronic device in accordance with the first embodiment of the invention.

Referring to FIG. 3, the invention also provides a method for fabrication of an anti-UV electronic device which comprises step 301 to step 309. The fabrication begins with step 301 in which a wafer is provided. Then, the fabrication method continues with step 303 in which a plurality of integrated circuit dies are formed in the wafer, wherein each of the integrated circuit dies has a UV light erasable memory. The integrated circuit dies are formed by the conventional method known to those skilled in the art including photolithography processes or etching processes, and the integrated circuit dies comprise one time read only memory (OTP ROM).

The fabrication method continues with step 305 in which an anti-UV light layer is formed on the UV light erasable memory. The anti-UV light layer can completely cover the UV light erasable memory and has a thickness of about 8-100 mm. The anti-UV light layer is formed by an ink jet printing method or slot coating method. Note that the methods for forming the anti-UV light layer are not limited to the methods mentioned herein, and other coating methods in which the anti-UV light layer can be formed on the UV light erasable memory are included within the scope of the invention.

Additionally, before step 305, the fabrication method further comprises a wafer test process to test the function of the integrated circuit die and check the electrical connections in the memory, wherein the wafer test process comprises a chip probing test (CP test), a circuit probing or a wafer level testing.

The fabrication step continues with step 307 in which the wafer is diced to form a plurality of integrated circuit dies with the anti-UV light layer. Then, the fabrication method continues with step 308 in which a package process is performed in accordance with practical applications.

In one embodiment, as shown in FIG. 2, the integrated circuit die 101 with an anti-UV light layer 105 is bonded to the printed circuit board 203, wherein the anti-UV light layer 105 faces the printed circuit board 203. Then, the integrated circuit die 101 and printed circuit board 203 are laminated between the first substrate 207 and the second substrate 209 to form a smart card. The memory of the smart card is protected by the anti-UV light layer to prevent the data in the memory from being erased by UV light. As a result, the reliability of the smart card is improved.

Figure 4A:
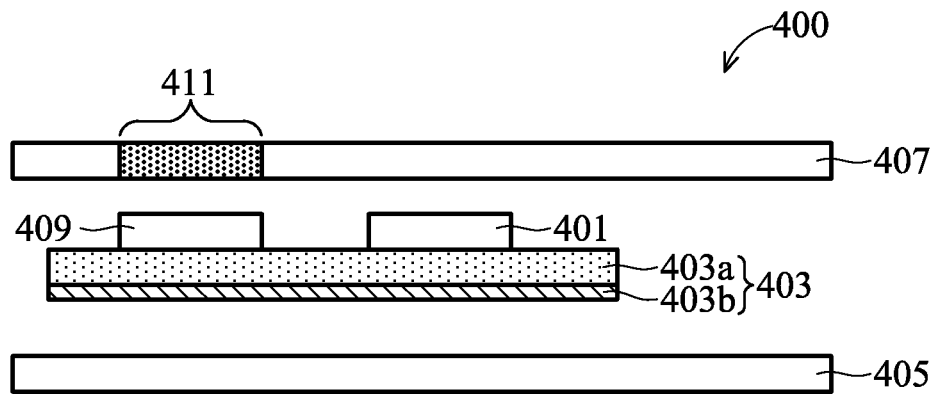
FIG. 4A show a cross-sectional schematic representation of an anti-UV electronic device in accordance with the second embodiment of the invention.

FIG. 4A shows an anti-UV electronic device in accordance with a second embodiment of the invention. The anti-UV electronic device 400 comprises a integrated circuit die 401 and a printed circuit board 403 formed between a first substrate 405 and a second substrate 407. The integrated circuit die 401 comprises a UV light erasable memory (not shown in figure), and the printed circuit board 403 comprises a printed circuit board main board 403a and an anti-UV light layer 403b. In one preferred embodiment, the integrated circuit die 101 comprises an electrophoretic display (EPD) die, and the UV light erasable memory comprises a one time programmable read only memory (OTP ROM).

The integrated circuit die 401 is formed on the print circuit board 403 with electrical wire connection structures (not shown in figures) and active device 409. A UV light erasable surface of the UV light erasable memory (not shown in figures) faces to the printed circuit board 403. The first substrate 405 and second substrate 407 are disposed oppositely, and the printed circuit board 403 and integrated circuit die 401 are encapsulated by the first substrate 405 and second substrate 407. Additionally, the second substrate has a gold finger 411, and the gold finger 411 electrically connects to the active device 409 and the electrical wire connection structures (not shown in figures).

In the second embodiment, the anti-UV light layer 403b is formed on the printed circuit board 403, and the anti-UV light layer 403b faces the UV light erasable surface (not shown in figure); therefore the printed circuit board 403 has anti-UV effect. The anti-UV light layer 403b is formed by an ink jet printing method or slot coating method.

Note that in one preferable embodiment, the coating area of the anti-UV light layer 403b is equal to that of the printed circuit board main board 403a, as shown in FIG. 4A. In another embodiment, the coating area of the anti-UV light layer 403b is smaller than that of the printed circuit board main board 403a. The area of the anti-UV light layer 403b may be smaller than or equal to that of the printed circuit board main board 403a, and the location of the anti-UV light layer 403b corresponding to the UV light erasable surface are included within the scope of the invention. Additionally, the first substrate 405, the second substrate 407, the active device 409 and the anti-UV light layer 403b in the second embodiment is the same as those in the first embodiment, and thus, are omitted herein.

Figure 4B:
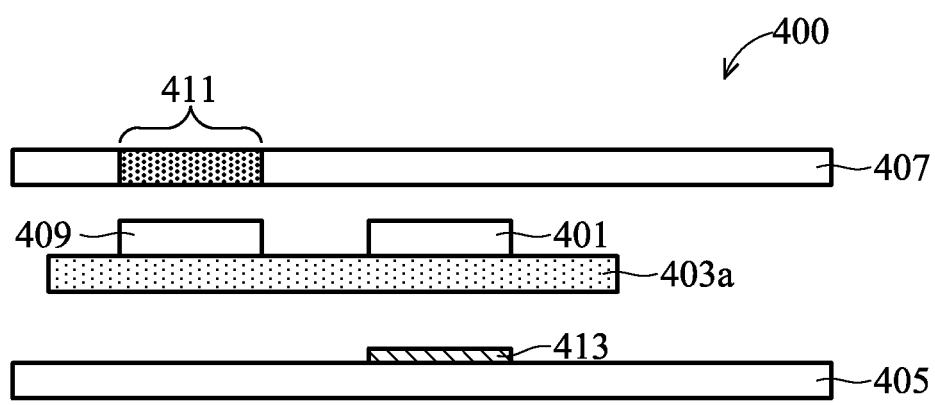
FIG. 4B show a cross-sectional schematic representation of an anti-UV electronic device in accordance with the third embodiment of the invention.

FIG. 4B shows an anti-UV electronic device in accordance with a third embodiment of the invention. Some structures have been omitted for clarity and like elements are identified by the same reference numbers as in FIG. 4A. The difference between FIG. 4A and FIG. 4B is that the anti-UV light layer 413 is formed on the first substrate 405, wherein the anti-UV light layer 413 corresponds to a UV light erasable surface (not shown in figure) of the integrated circuit die 401. Thus, the first substrate 405 has anti-UV effect to prevent the data in the memory from being erased by UV light.

Therefore, the anti-UV light layer 105 can be directly formed on the UV light erasable surface 103 (FIG. 1), and can be formed on a printed circuit board (FIG. 4A) or on the first substrate 405 (FIG. 4B) to prevent the data in the memory from being erased by UV light and improve the reliability of the memory. Additionally, when the one time programmable read only memory (OTP ROM) is used in the smart card, the thickness of the anti-UV light layer is only about several μm; thus, the thickness of the smart card is not significantly increased. Therefore, application of the memory is improved.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An anti-UV electronic device, comprising:
   a printed circuit board (PCB), wherein the printed circuit board has a active device;
   an integrated circuit die formed on the printed circuit board, wherein the integrated circuit die has an ultraviolet (UV) light erasable memory and an ultraviolet (UV) light erasable surface of the ultraviolet (UV) light erasable memory facing the printed circuit board;
   a first substrate and a second substrate, wherein the first substrate and the second substrate are disposed oppositely and the printed circuit board, and integrated circuit die are encapsulated by the first substrate and the second substrate, and the second substrate has a gold finger, and the gold finger electrically connects to the active device; and
   an anti-UV layer formed on the printed circuit board, the first substrate and the integrated circuit die, corresponding to the ultraviolet (UV) light erasable surface.

2. The anti-UV electronic device as claimed in claim 1, wherein the integrated circuit die comprises an electrophoretic display (EPD) die, and the memory comprises a one time programmable read only memory (OTPROM).

3. The anti-UV electronic device as claimed in claim 1, wherein the anti-UV light layer has a thickness between 8-100 μm.

4. The anti-UV electronic device as claimed in claim 1, wherein the first substrate and the second substrate comprise plastic substrates.

* * * * *